United States Patent [19]

Seleznev et al.

[11] 4,161,037

[45] Jul. 10, 1979

[54] FERRITE CORE MEMORY

[75] Inventors: Jury E. Seleznev; Jury A. Burkin; Sergei V. Kuzmin, all of Novosibirsk, U.S.S.R.

[73] Assignee: Vychislitelny Tsentr Sibirskogo Otdelenia Akademii Nauk SSSR, U.S.S.R.

[21] Appl. No.: 759,872

[22] Filed: Jan. 17, 1977

Related U.S. Application Data

[60] Continuation of Ser. No. 516,131, Oct. 18, 1974, abandoned, which is a division of Ser. No. 319,053, Dec. 27, 1972, Pat. No. 3,858,310.

[51] Int. Cl.² .............................................. G11C 5/08
[52] U.S. Cl. ....................................... 365/51; 365/67; 365/130
[58] Field of Search ... 340/174 M, 174 MA, 174 NC, 340/174 VC; 29/604, 737; 365/67, 70, 51, 130

[56] References Cited

U.S. PATENT DOCUMENTS

| | | | |
|---|---|---|---|
| 2,667,542 | 1/1954 | Wright | 365/130 |
| 2,908,893 | 10/1959 | Rosenberg et al. | 340/174 NC |
| 3,058,096 | 10/1962 | Humphrey, Jr. et al. | 340/174 M |
| 3,238,516 | 1/1966 | Hore | 365/130 |
| 3,641,519 | 2/1972 | Ashley | 365/130 |

*Primary Examiner*—James W. Moffitt
*Attorney, Agent, or Firm*—Holman & Stern

[57] ABSTRACT

A ferrite core memory in the form of a hollow plait of ferrite matrices. The ferrite matrices comprise ferrite cores interwoven with coordinate wires and wires forming readout and inhibition windings. The hollow plait consists of alternating squares of ferrite matrices connected at their edges and formed into a hollow cylindrical plait. The diagonal lines of the matrices extend axially and transversely of the plait. The coordinate wires interweaving the ferrite cores extend along orthogonally intersecting helical lines lying on the cylindrical surface of the plait. The outgoing leads of the readout and inhibition windings are distributed longitudinally along the plait.

1 Claim, 13 Drawing Figures

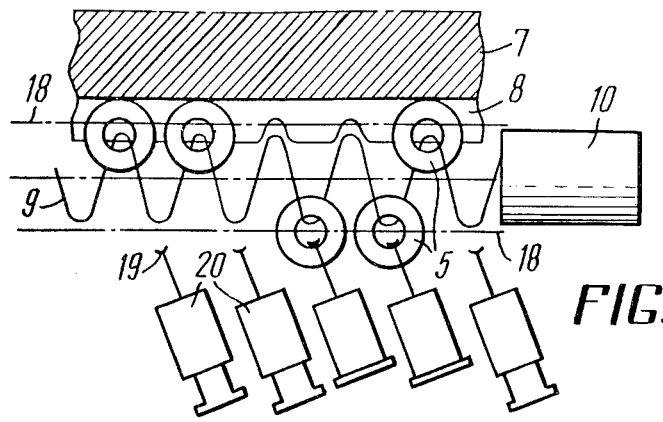
FIG.5
FIG.6
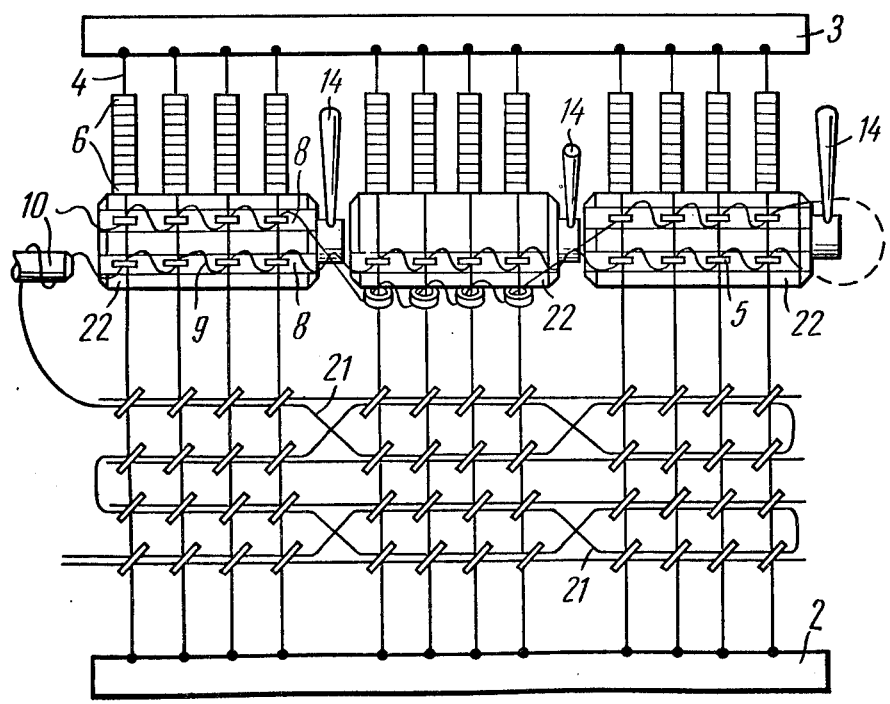

FERRITE CORE MEMORY

This is a continuation of application Ser. No. 516,131, filed Oct. 18, 1974, now abandoned, which in turn is R.60 Divisional of U.S. Ser. No. 319,053, filed Dec. 27, 1972, now U.S. Pat. No. 3,858,310.

BACKGROUND OF THE INVENTION

The invention relates generally to processes of making memory devices including ferrite cores, for the memories of electronic computers, for logic automatic apparatus, for control and communication circuits, monitoring systems and more particularly, it relates to methods of production of ferrite matrices and core memories and to apparatus for performing such methods.

The invention can be employed for the production of ferrite matrices with any desired disposition of the cores at the intersections of the wires in a matrix, as well as for the production of ferrite core memories in the form of carpets, plaits, frameless storage devices of practically any capacity from cores of any size, super-mini cores included.

There are known various methods of making ferrite matrices. One of them comprises the steps of first putting the ferrite cores about the wires extending along one of the coordinates in stacks, then mounting these wires parallel to one another in an array onto a framework, the number of the wires and the number of the cores about each wire corresponding, respectively, to the number of the columns and lines in the matrix to be made.

Then one core is separated from each stack, and the cores are indexed in a desired direction, i.e. each core is positioned at 45 angular degrees with respect to the wire, in either direction, in accordance with the predetermined threading pattern. Thus indexed, the cores are arranged in a row, and a needle is threaded therethrough in the direction of the second coordinate, the needle dragging thereafter a mounting wire, in which way a line of the ferrite matrix is made.

The threading of the cores is continued in the same manner, line by line, and, after the coordinate grid has been completed, the readout-inhibition windings are threaded through.

This method is practiced nowadays as a widely popular manual technique of making ferrite matrices.

The disadvantages of this known method are the difficulty of threading through a line with a needle, on account of the eyelet in each core being diminished by the turned position of the core; the difficulty of butt-soldering the wire to the needle and of subsequent finishing of the soldered joint; the eventuality of harming the cores and the insulation of the mounting wire with the steel needle, particularly, by the pointed end thereof and by the soldered joint; the complications encountered at attempts to mechanize this manual process embracing separation and indexing of the cores, arranging them in the threading zone; and, finally, the fact that it is virtual impossibility of introducing mechanization in this manual process in the case of super-mini cores.

Based on the above-described known method, as applied in the case of relatively large cores having an external diameter above 1 mm, there has been developed an apparatus introducing mechanization into the process of threading ferrite matrices. This known apparatus comprises a framework on which an array of wires having the cores put thereabout is mounted. Extending transversely of the wires is a core separating member in the form of a plurality of contoured combs, of which one retains the stacks of the cores, while the other one, spaced from the first one by a spacer corresponding to the height of the cores, separates by its sharp edge one core from the stack on each wire, whereafter the first comb is driven clear of the separated cores, and they slide down the respective wires. Mounted parallel to the separating member is an indexing member in the form of contoured toothed strips turning the cores in desired directions and fixing them in the turned positions. The contoured strips have a notch at their division zone, which notch acts as the guiding channel for the needle with the threading wire, in the area of the eyelets in the cores.

The above-described apparatus is of a complicated structure and involves the use of numerous precision-manufactured parts.

At present, there are employed apparatus for threading ferrite matrices having the cores of an external diameter in excess of 1 mm. The attempts to create a similar apparatus which would handle cores with the external diameter equal to 0.8 mm have so far proved futile. It should be remembered that the present-day technology involves threading of cores with the external diameter as small as 0.3 mm to 0.6 mm, and even 0.2 mm in certain cases.

It is obvious that the core threading operation, which so far has been a manual one, is bound to become completely automated, if it is to be employed with cores of extremely small diameters. The operation becomes too complicated for the skill of a man, whereas the poor productivity of the manual operation, considered in view of the ever growing demand for ferrite memory devices, makes the automation of this process an outright economic necessity.

Among the disadvantages of the above-specified known apparatus for threading comparatively large cores are: insufficient dependability of separation of the cores from the stacks, the necessity of employing needles, with all the complications this necessity involves (e.g. harming of the cores and of the insulation of the wire, the operation of preparing the needle, the eventuality of the wire breaking loose from the needle in the course of a line threading operation, manual guiding of the needle into the guiding channel). The employment of positive physical turning of the cores of small sizes practically always leads to breaking the cores either partly or completely, greatly strains the eyes of the operator, reduces the productivity of labor; in the case of super-mini cores, as small and as light as dust, the apparatus simply cannot be operated.

There is yet another known method and apparatus for threading ferrite matrices, in accordance with which vibration is employed to position the cores in a specially designed mask-holder in the form of a strip with openings made therethrough, the openings having the outline and the size of a core. The openings are situated in the places which the cores are to occupy in the matrix, with the cores turned strictly at 45° with respect to the lines and columns of the matrix, in accordance with a desired pattern. The mask has a substrate with a tacky layer adhered thereto on one side thereof, so that each opening becomes a cell with a tacky bottom to hold a core. The mask is positioned above the cores, with the tacky layer of the mask facing the cores, and the latter, jumping chaotically under the action of vibration, stick in the cells of the mask.

Once positioned in the mask, the cores are threaded through with hollow needles extending in perpendicular directions, and the coordinate wires are passed through these needles. Then the tacky layer and the mask itself are removed. In this way, the problem of introducing automation into some of the processes of making memory matrices has been solved.

This present-day technique, however, is not free from certain disadvantages: the masks and the needles employed are high-precision, complicated and costly articles. The masks, which are made with great difficulty in the case of mini cores, are not completely filled with the cores in the vibratory machine. Placing the cores manually into the unfilled cells of the mask reduces the productivity and results in harming of the mask itself and of the adjacent cores. The hollow needles for cores which are by far not the tiniest ones, e.g. those having diameters equal to 0.3 mm, 0.17 mm, 0.06 mm, are bound to have the external diameter thereof (for threading but two coordinate wires through a core, considering that the core is turned, and the first wire occupies the space in the eyelet) approximating 60 microns, and the internal diameter of the needles should provide for the passage of a wire not thicker that 40 microns, which is extremely difficult to attain; when the wires are of a considerable length, the process cannot be performed altogether.

The operation of removal of the tacky layer and of the mask itself from the threaded matrix also results in harming of the cores, which further reduces the percentage of acceptable product.

The above technique makes it impossible to perform testing of the electric properties of the cores and replacement thereof, should a core prove faulty, directly in the process of threading, until its completion, since making good of a detected fault in no way simplifies, but, most certainly, complicates the operation, as compared with the alternative of repairing a ready matrix.

The above technique introduces mechanization into that part of manual operation which is the most labor-consuming one, even the major one, but merely a fraction of the entire process of making a ferrite matrix. Numerous operations, including re-filling of the masks, inspection of the filled-in masks, assembling them over the full space of a matrix, indexing of the needles for threading, soldering of the inter-matrix connections of the coordinate wires, repairing of the masks, should a core prove faulty, are still performed manually and greatly strain the eyes of the operator.

The technique makes it possible to do without soldering only in the case of matrices of small capacities; it is impractical in case of super-mini cores having an external diameter below 0.4 mm.

SUMMARY OF THE INVENTION

An object of the present invention is to provide a method of making ferrite matrices and an apparatus for performing such method, which will make it possible to introduce automation into the process of threading ferrite matrices of great capacities.

Another object of the present invention is to provide an apparatus enabling automatic manufacturing of ferrite matrices made up of super-miniature cores.

Still another object of the present invention is to reduce the number of soldered connections of the wires in a ferrite core memory.

With these and other objects in view, the invention resides in a method of making ferrite matrices, comprising the steps of putting the ferrite cores, the number of which corresponds to the number of the lines of a ferrite matrix to be made, arranged in stacks, about at least one wire, arranging the stacks into an array, the number of the stacks being equal to the number of the wires extending along one coordinate direction of the matrix to be made, separating preferably from each stack one of the cores, arranging the separated cores in a row and threading therethrough at least one additional wire in the direction of the other one of the coordinates of the matrix, thus making one line of the matrix, in which method, in accordance with the invention, the cores separated from the stacks are arranged in a plane intersecting the wires, and the at least one additional wire to be threaded therethrough in the direction of the other coordinate is wound into a helix, so that the leading end of the helix, when the latter is rotated and forwarded longitudinally, passes in succession through all of the cores arranged in the plane, at least one of the cores being thus positioned about at least each turn of the helix, thereafter the wire is straightened, whereby the cores become positioned at the intersections of the wires, each of the cores being turned into a desired angular position.

In order to index the cores in a line of the matrix in perpendicular angular positions, it is advisable that the cores arranged in the plane intersecting the wires should be grouped into two rows spaced by a distance equal to the diameter of the helix into which the additional threading wire is wound, with the cores in one of the two rows being staggered with respect to the cores in the other one of the rows by a half of the pitch of the helix, whereby the cores in the different rows will become indexed in the line of the matrix in perpendicular angular positions.

In order to index the cores in the adjacent lines of the matrix in perpendicular angular positions, the adjacent lines should be threaded through with the additional wire being wound in helices of opposite directions.

An apparatus for making ferrite matrices, wherein wires with stacks of ferrite cores received thereabout on a framework, comprises, in accordance with the present invention, a core feeding member having at least one longitudinal guide adapted to take single ones of the cores and arrange them in a row, the core feeding member having the wires with the stacks of the cores passing thereover at one side thereof, the core feeding members spacing the wires at uniform intervals equalling the pitch of a threading helix; at least one mechanism for winding an additional wire into a helix, associated with a drive and mounted adjacent to the face end of the core feeding member, the mechanism for winding the additional line threading wire into a helix having a pitch equal to the spacing between the centers of the the cores arranged in the row by the core feeding member, an auxiliary roller mounted parallel to the core feeding member and contacting the helix, the auxiliary roller having a plurality of annular grooves spaced at uniformed intervals equalling the pitch of the helix, the auxiliary roller being mounted so that the grooves are staggered from the centers of the cores by a distance corresponding to the helix angle of the helix, and the auxiliary roller being associated with the drive so as to be rotated thereby in a direction opposite to the direction of winding of the helix.

Preferably, the core feeding member is made in the form of a roller having a plurality of spaced reduced-diameter portions, the spacing being equal to the pitch of the helix, the longitudinal guides for supporting the cores being provided in one plane both at the bottoms of the reduced-diameter portions and in the shoulders therebetween, whereby the cores supported thereby are positioned in two rows spaced by a distance corresponding to the diameter of the threading helix.

The apparatus may further comprise a second core feeding member having a longitudinal guide extending parallel to the first-mentioned core feeding member, the respective longitudinal guides of the core feeding members facing each other, the wires with the cores received thereabout being arranged in two arrays and passing over the two core feeding members on the internal side thereof, so that the cores are supported in the respective longitudinal guides in two rows spaced by a distance corresponding to the diameter of the threading helix, with the cores in one of the rows being staggered relative to the cores in the other one of the rows by one half of the pitch of the helix.

The apparatus may further comprise grippers mounted in opposition to each core supported in the longitudinal guide of the core feeding member, the grippers being associated with actuators for displacing selectively the cores into a second row. The grippers may be associated with mechanisms for selectively either returning the cores supported in the guides of the core feeding member back into the respective stacks, or displacing the cores beyond the second row.

It is alternatively advisable that the core feeding member be divided longitudinally into a plurality of sections, each of the sections having at least two of the longitudinal guides and being associated with an independent drive adapted to move the sections selectively, to bring the longitudinal guides of the different ones of the sections into alignment.

Preferably, the mechanism for winding the additional wire into the helix includes a spindle with a cleft in one end thereof, adapted to retain the additional wire, a sleeve having a thread of the same direction and pitch as the helix, the sleeve receiving the spindle thereinside, a retaining member selectively coupling the sleeve with the spindle, and a helix-forming member of a split structure including die taps spring-urged to the tapering portion of the helix and having a helical groove.

The mechanism for winding the additional wire into the helix may comprise a second sleeve received about the first sleeve and having a thread of the same pitch as the first sleeve, but of the opposite direction, and an additional retaining member selectively coupling the sleeves, the helical groove in the die taps being two-directional.

The object is attained also in a ferrite core memory made up from matrices produced in accordance with the herein disclosed method, the core memory being in the form of a hollow plait in which the a plurality of matrices are arranged at both sides of the cylindrical surface of the plait in alternating squares, the respective diagonal lines of the squares extending axially and transversely of the plait, the coordinate wires interweaving the cores extend along orthogonally intersecting helical lines lying on the surface of the plait, the outgoing leads of the readout-inhibition windings of the core memory being distributed longitudinally of the hollow plait.

The object of the invention is further attained in a ferrite core memory made up from matrices produced by the method in accordance with the invention, the matrices overlying one another and being electrically interconnected, in which core memory, according to the invention, the matrices are interconnected at the border lines thereof by solid coordinate wires extending throughout the core memory.

The invention thus provides for introducing mechanization into the threading process for eliminating the mounting frames of ferrite matrices and for reducing the number of soldered connections between the coordinate wires, the length of the wires being maximal.

The invention minimizes the amount of manual labor involved, reduces the strain of the operator's eyes, reduces the dimensions of ferrite core memories, offers the possibility of testing the matrices and to make good any faults thereof directly in the process of making a matrix, eliminates the masks and soldering, brings automation and mechanization into the main operations of the threading process, improves the quality of ferrite core memories, increases the productivity and improves labor conditions.

The above assets result in a reduced cost of the product.

One possible product of the apparatus according to the invention, a ferrite core memory in the form of a hollow plait of which the walls are constituted by the ferrite matrices, provides ready access to the cores and improves the thermal duty of the core memory in operation; furthermore, depending on the desired mode of assembling of the ferrite core memory with the electronic blocks it is associated with, the core memory may be curved longitudinally into any desired configuration, which reduces substantially the length of the conductors that are to be laid between the core memory and the electronic blocks, which reduces electrical losses and improves the dynamic characteristics of the core memory. The thermal duty is also improved because the cores are arranged in one layer throughout the entire length of the plait-like core memory, and any cooling medium can be easily introduced into the internal space of such core memory.

The other alternative product of the method, the ferrite core memory made up from flat matrices overlying one another, with soldering of the wires along the border lines of the matrices, may be produced without such soldering, with solid coordinate wire passing through all the matrices of the core memory in a "zigzag" fashion.

BRIEF DESCRIPTION OF THE DRAWINGS

The present invention will be more clear from the description of the embodiments thereof, with reference to the accompanying drawings, wherein:

FIG. 5 is the apparatus for making ferrite matrices where any of the cores can be turned in perpendicular directions;

FIG. 6 is an apparatus with the core feeding member divided into sections with two longitudinal guides, according to the invention, and a part of a ferrite matrix wherein the second threading wire passes from one line to another internally of the matrix;

DETAILED DESCRIPTION OF THE PREFERRED EMBODIMENTS

Figure 1:
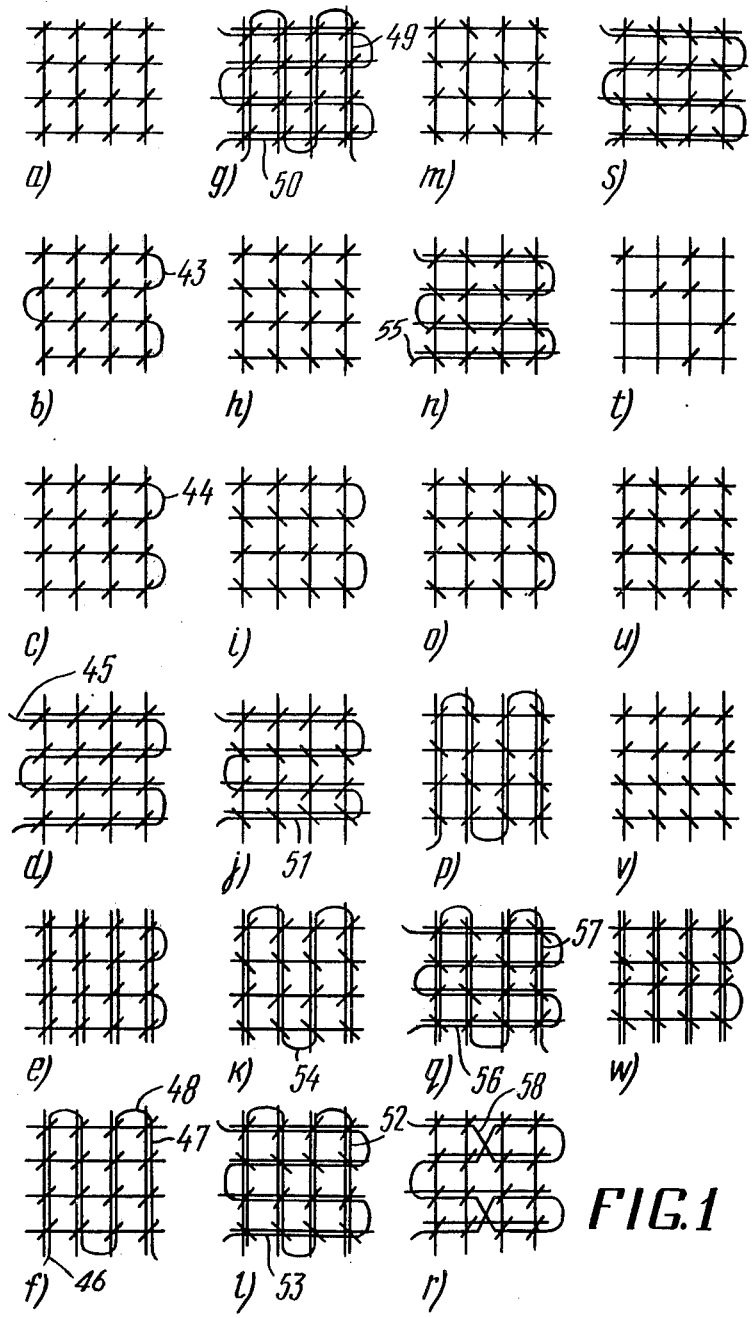
FIG. 1(a)–FIG. 1(w) show schematically various possible patterns of the arrangement of the cores and wires in ferrite matrices produced by an apparatus embodying the invention.

Referring now to the drawings, an apparatus for making ferrite matrices comprises a framework 1 supporting thereon, with the aid of strips 2 and 3, a plurality of wires 4 receiving thereabout each a plurality of ferrite cores 5 arranged in stacks 6, the number of the cores corresponding to the number of the lines in the ferrite matrices to be manufactured by the apparatus, or, alternatively, in a ferrite core memory to be manufactured thereby. The wires 4 are arranged in a side-by-side fashion, the number of the wires being equal to the number of the wires extending along the respective one of the two coordinates of the matrix to be made. The framework 1 has further mounted thereon a rotatable core feeding member 7 in the form of a roller with a longitudinal guiding slot 8 adapted to grip the cores and to arrange them in a line, one core about the respective one of the wires.

The wires 4 are uniformly spaced along the core feeding member 7, the spacing being equal to the pitch of a threading helix 9, the wires being run over one side of the member 7 under a slight tension.

Disposed adjacent to one face end of the core feeding member 7 is at least one mechanism 10 for coiling the wire effecting threading through the cores in the direction of the second one of the two coordinates, the wire being coiled, or wound into a helix with a pitch corresponding to the spacing between the centers of the adjacent pairs of the cores 5 engaged by the feeding member 7. The wire coiling mechanism 10 is associated with a drive 11. Extending parallel to the core feeding member 7, on the side of the cores 5 arranged in the line to be threaded through, is at least one rotatable auxiliary roller 12 adapted to engage the helix 9 at spaced points along the entire extent thereof longitudinally of the feeding member 7. The auxiliary roller 12 has made therein a plurality of annular grooves 13 uniformly spaced longitudinally along the roller 12, the spacing being equal to the pitch of the helix 9, the roller 12 being mounted so that the annular grooves thereof are longitudinally displaced with respect to the adjacent centers of the cores 5 by a distance corresponding to the helix angle of the helix 9. Thus, the helix 9 is positioned intermediate of the feeding member 7 and the annular grooves 13 of the auxiliary roller 12 so that the cores 5 arranged in a line by the feeding member 7 will find themselves in the respective areas adjacent to the line along which the helix 9 contacts the feeding member 7. The auxiliary roller 12 is associated with a drive, e.g. with the same drive 11 associated with the mechanism 10 for winding the helix 9, the condition being that the roller 12 will be rotated simultaneously with the rotation of the helix 9 in a direction opposite to the direction of the winding of the helix 9, and that the linear speed of the points of the roller 12 engaging the helix 9 will be slightly greater than the linear speed of the corresponding points of the helix 9.

In order to effect separation of single cores 5 from the respective stacks 6 and arrangement of the cores in a line along the feeding member 7, the latter is associated with a handle 14 by means of which the feeding member 7 can be rotated upwardly with respect to the framework 1 into a position at which the longitudinal guiding slot 8 aligns itself with the bottommost cores 5 in the stacks 6, whereafter the feeding member 7 can be rotated in the reverse direction, i.e. downwardly, into a position where the line of the cores 5 engaged by the slot 8 is released by this slot.

Figure 3:
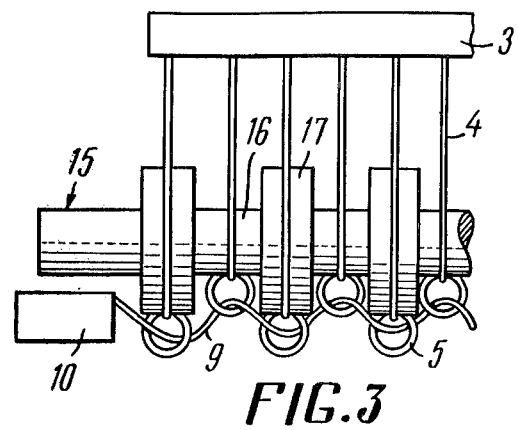
FIG. 3 is the core feeding member of the apparatus, having spaced shoulders for arranging the cores in two rows, according to the invention.

To provide for the possibility of threading the cores 5 into a matrix wherein the cores will be alternatingly angularly displaced relative to each other through 90° either within each line (FIG. 1 "u") or in adjacent lines (FIG. 1 "m" to "q"), the feeding member may have an alternative structure, e.g. it may be in the form of a roller 15 (FIG. 3) having a plurality of reduced-diameter portions 16 spaced longitudinally of the roller 15, the spacing between the adjacent reduced-diameter portions being equal to the pitch of the threading-through helix 9. In this case, the longitudinal slots 8 are cut both in the larger-diameter portions 17 of the roller 15 and in the reduced-diameter portions 16 thereof, the slots 8 being aligned within a single plane. The distance between a slot 8 in the larger-diameter portion 17 and a slot 8 in the reduced-diameter portion 16 corresponds to the diameter of the threading-through helix 9, as measured radially of the roller 15. Thus, the helix 9 coiled in a single direction provides that cores 5 in the adjacent columns of a matrix are perpendicular to one another (FIG. 1 "u"). If the direction of the coiling of the helix 9 is alternated from one to the next successive line, the adjacent cores 5 will be perpendicular to one another both in the lines and columns of the matrix produced (FIG. 1 "m" to "q").

Figure 4:
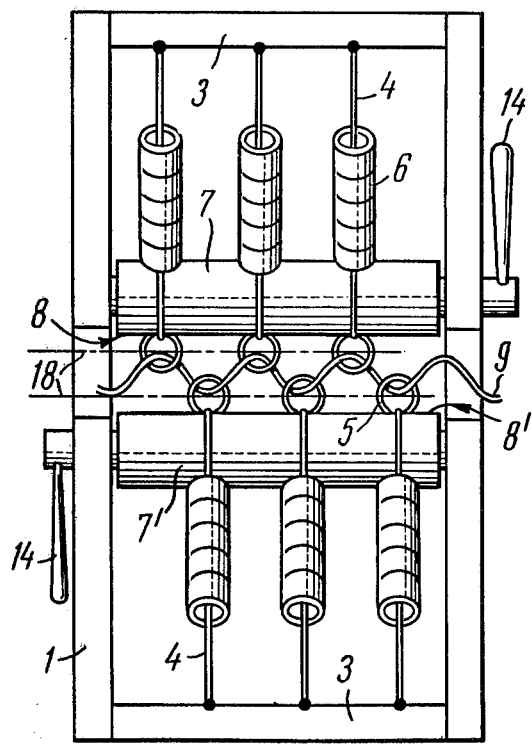
FIG. 4 is the apparatus with two parallel core feeding members for making ferrite matrices where the adjacent cores are turned in perpendicular directions.

Alternatively, in order to produce matrices wherein the cores will be rotated relative to one another in the above-described fashion, the herein disclosed apparatus may incorporate a pair of core-feeding members 7 and 7' (FIG. 4) mounted on the framework 1. In this case, the core-feeding members 7 and 7' are both in the form of rollers provided with longitudinal slots 8 and 8', respectively, the two rollers extending parallel to each other and having their respective slots 8 and 8' normally facing each other. The wires 4 run over the members 7 and 7', entering the space intermediate of the two rollers, the wires 4 being alternatingly arranged in two series above the respective ones of the members 7 and 7', whereas beneath the members 7 and 7' the wires 4 run in a single parallel row, forming a matrix (see FIG. 1 "u" and FIG. 1 "m" to "q"). The wires 4 are uniformly spaced longitudinally of the respective core-feeding members 7 and 7', the spacing being equal to the pitch of the threading-through helix 9, each wire 4 engaging either one of the two core-feeding members 7 and 7', being spaced from the adjacent wires 4 engaging the other one of the members 7 and 7' through a distance equal to one half of the pitch of this helix 9. In this embodiment of the invention, the cores 5 separated from the stacks are arranged in the respective slots 8 and 8' in two rows 18, the rows being spaced by a distance equal to the diameter of the helix 1 of the threading-through wire.

Similarly to the previously described embodiment of the invention, the direction of the coiling of the helix 9 determines the pattern of the cores in the matrix produced.

In order to provide the possibility of threading ferrite matrices with any desired angular position of any core at the intersection points of the coordinate wires (FIG. 1 "s"), the herein disclosed apparatus may incorporate a plurality of grippers 19 (FIG. 5), each gripper being disposed in opposition to the respective one of the cores 5 held by the core-feeding member 7. The grippers 19 are in the form of hooks that can engage the cores 5 in the area of the stacks 6. Each gripper 19 is associated with an independent actuator 20, whereby any one of the grippers 19 can be actuated to engage the respective opposite core 5 in the guiding slot 8 and to displace it into the second row 18 of the cores, i.e. to displace it through a distance equal to the diameter of the threading-through helix 9, with simultaneous displacement of the last-mentioned core 5 through a half of the pitch of this helix 9.

To produce matrices intended for permanent memory devices having a structure of the kind illustrated in FIG. 1 "t," the actuators 20 with the grippers 19 are capable of displacing the cores 5 beyond the second row 18.

In order to provide a possibility of threading a second wire through the cores in the rows of a matrix, the wire making cross passages 21 (FIG. 6) within the matrix from one row into another, the core-feeding member is made up from a series of individual sections 22, the number of the sections being equal to the number of the desired cross passages 21 plus one, each one of the sections 22 having two longitudinal guiding slots 8. In this case, each section 22 of the core-feeding member is associated with the individual actuating handle 14 by means of which the longitudinal guiding slots 8 of the appropriate sections 22 can be selectively aligned.

Figure 7:
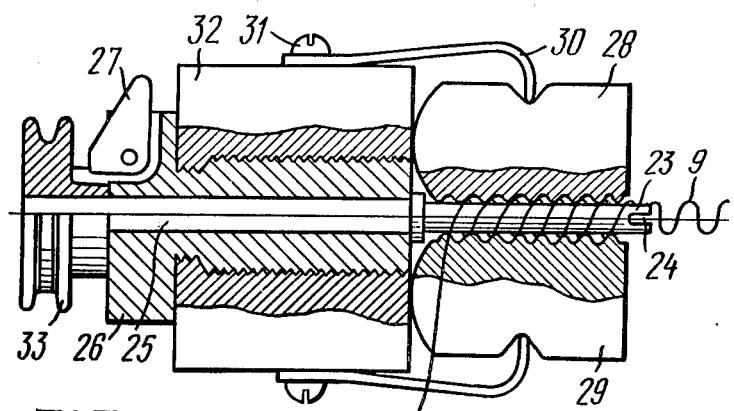
FIG. 7 is a mechanism for winding the wire into a helix of one directon, according to the invention.

The wire coiling mechanism 10 of the present invention, employed either for production of large matrices manufactured simultaneously on several such apparatus operating in parallel, with the threading-through wire being handed over from one apparatus to another, or else for threading a single wire through a pair of adjacent lines, leaving an unbroken loop between the two lines, has to meet certain specific requirements. In other words, the mechanism should provide for removing the helix therefrom without the wire being severed. In most cases the wire employed is a relatively thin copper wire in an insulation sheath which should be maintained intact. The operation of threading the wire into the mechanism 10 and that of removing the wire therefrom should be as simple and as quick as possible. In order to meet this requirement, the wire coiling mechanism 10 incorporates a spindle 23 (FIG. 7) with a radial cleft 24 in the end face thereof for retaining the wire being threaded in. Tail end 25 of the spindle is received in a sleeve 26 having a thread of which the direction and the pitch are, respectively, the same as those of the helix 9 to be formed. The threaded sleeve 26 is associated with a retaining member 27 which ensures positive coupling of the sleeve with the spindle 23. The helix-forming member is made up by a pair of separate die taps 28 and 29 having an internal helical groove corresponding to the helix 9 to be formed. The two die taps 28 and 29 are resiliently biased toward the tapering periphery of the spindle 23 by a pair of leaf springs 30 fastened by screws 31 to a housing 32 of the mechanism.

The spindle 23 is adapted to be driven by the drive 11 through a pulley 33.

When it is desirable to facilitate changing of the direction of the helix being formed, the mechanism 10 can have an alternative structure.

Figure 8:
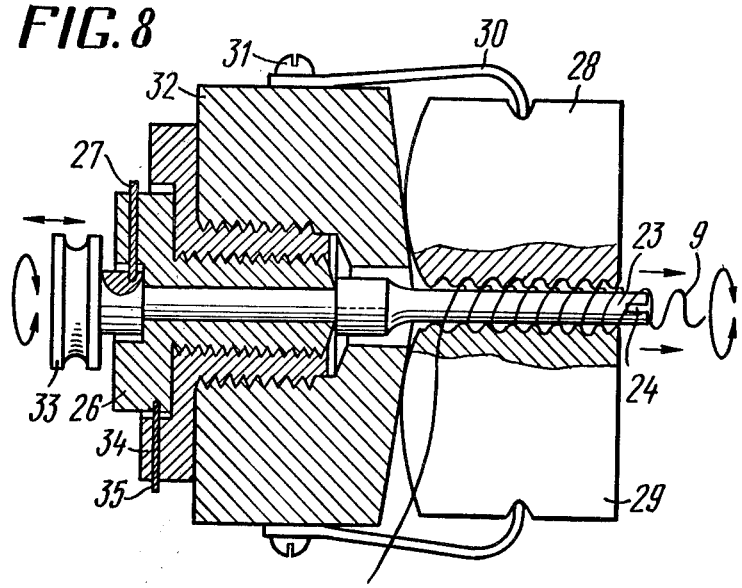
FIG. 8 is another modification of the mechanism for winding the wire into a helix, capable of making helices of either of the two directions.

The sleeve 26 (FIG. 8) having a thread of one direction is received, together with the spindle 23 and the retaining member 27, within another sleeve 34 having a helical thread of the opposite direction. The sleeves 26 and 34 are coupled, e.g. by means of another retaining member 35. In this case, the internal helical thread of the die taps 28 and 29 is two-directional; it should be remembered that the die taps 28 and 29 are in the form of those portions of the commonly-used thread-cutting die taps, where the crests of the thread are full-size ones. The two die taps engage therebetween the spindle 23 from diametrically opposed sides and are spring-biased toward the spindle.

A description of several structures of unique ferrite core memories that can be manufactured with the aid of the herein disclosed apparatus is given hereinbelow.

Figure 9:
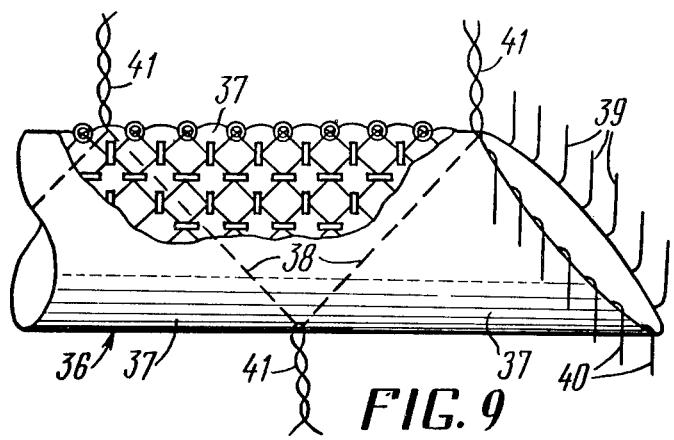
FIG. 9 diagrammatically illustrates a ferrite core memory in the form of a hollow plait, according to the invention.

FIG. 9 shows a ferrite core memory in the form of a hollow tubular plait 36 of which the walls are formed by individual ferrite matrices 37. To form the tube, a plurality of matrices connected edge to edge are helically coiled into tubular form so that a helical junction 38 (shown dotted in FIG. 9) is formed along the length of the plait. The diagonals of the individual matrix squares between the individual cores 5, will in the completed plait run longitudinally and circumferentially of the plait respectively while the coordinate wires 39 and 40 extend in opposed helices around the plait with their free ends projecting at the end of the plait. Outgoing leads of "readout" and "inhibition" windings of the separate matrices extend from those edges of the matrices forming the helical junction 38 of the plait and are thereby spaced longitudinally of the plait. The plait may be linear as shown or curved about its longitudinal axis.

It is also possible to produce a similar core memory including matrices wherein the number of the wires extending, respectively, in the two coordinate directions, is non-uniform.

Figure 10:
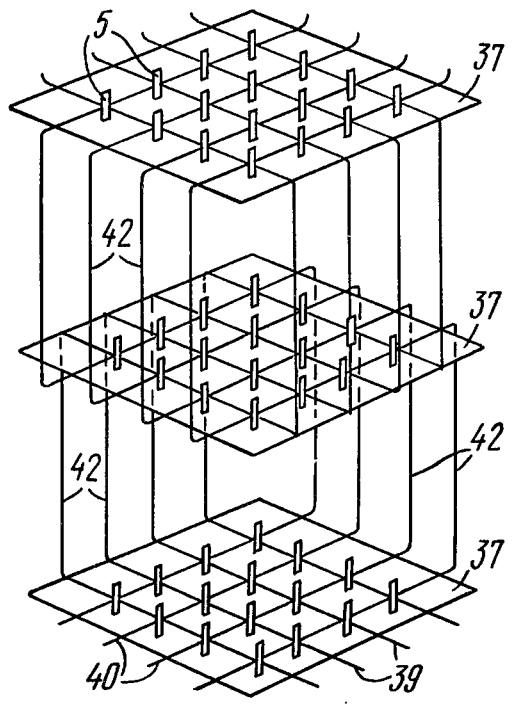
FIG. 10 illustrates a ferrite core memory wherein the connections between the matrices are effected with solid coordinate wires, according to the invention.

FIG. 10 of the appended drawings illustrates schematically the connections of a ferrite core memory made up by matrices 37 superimposed one onto another and connected by soldering at points 42 where the coordinate wires pass from one matrix into another. However, the herein disclosed method and the apparatus performing same make it possible to manufacture a ferrite core memory of this kind having no soldered connections in the areas 42 where the wires interconnect the matrices, but having continuous coordinate wires 39 and 40 of the two coordinate directions interwoven throughout the core memory.

Let us now explain the operation of the herein disclosed apparatus, describing at the same time the method according to the invention.

Figure 11:
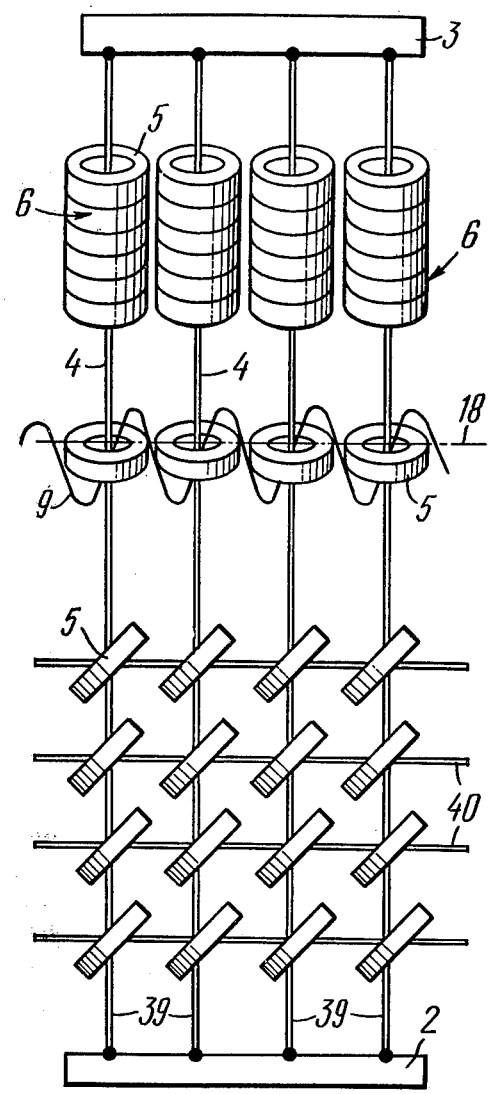
FIG. 11 is a schematic diagram of an apparatus, illustrating a method of making ferrite matrices, according to the invention.

It can be seen from FIG. 11 which presents a schematic diagram of the apparatus and illustrates the essence of the herein disclosed method that the coordinate wires 4 extending in one of the two coordinate directions are first threaded through ferrite cores 5 arranged in several stacks 6, whereafter individual cores 5 are separated from the stacks 6 and arranged in a row 18, one core 5 being separated from each one of the stacks 6. The disposition of the cores 5 within the row 18, with the cores lying in the common plane intersecting the wires 4, is determined by the pitch of the helix 9 into which the wire which is to be threaded through the cores along the other coordinate direction is coiled. Therefore, the cores 5 are arranged in the row 18 so that the cores are uniformly spaced, the spacing being equal to the pitch of the helix. After the wire coiled into the helix 9 has been threaded through the cores, the wire is straightened, whereby one line in the ferrite matrix being manufactured is formed; there is also formed the coordinate grid including at least two wires, with the cores 5 being located at the points of intersection of the two wires, the axes of the cores 5 being rotated in the same direction with a position where they extend at 45° in respect to the wires.

Then the above-described operation is repeated, and the threading through the cores 5 separated from the stacks 6 is carried on, line by line, in which way there is formed a ferrite matrix illustrated in FIG. 11, where the cores 5 extend diagonally in the same direction (FIG. 1 "a").

To produce a ferrite matrix (FIG. 12) where every two adjacent cores 5 within a single line will be perpendicular to each other, the cores 5 separated from the respective stacks 6 are arranged in two rows 18. The arrangement of the cores in the rows 18 is determined by the pitch and diameter of the helix 9 into which the wire that is to be threaded through the cores 5 is coiled.

Figure 12:
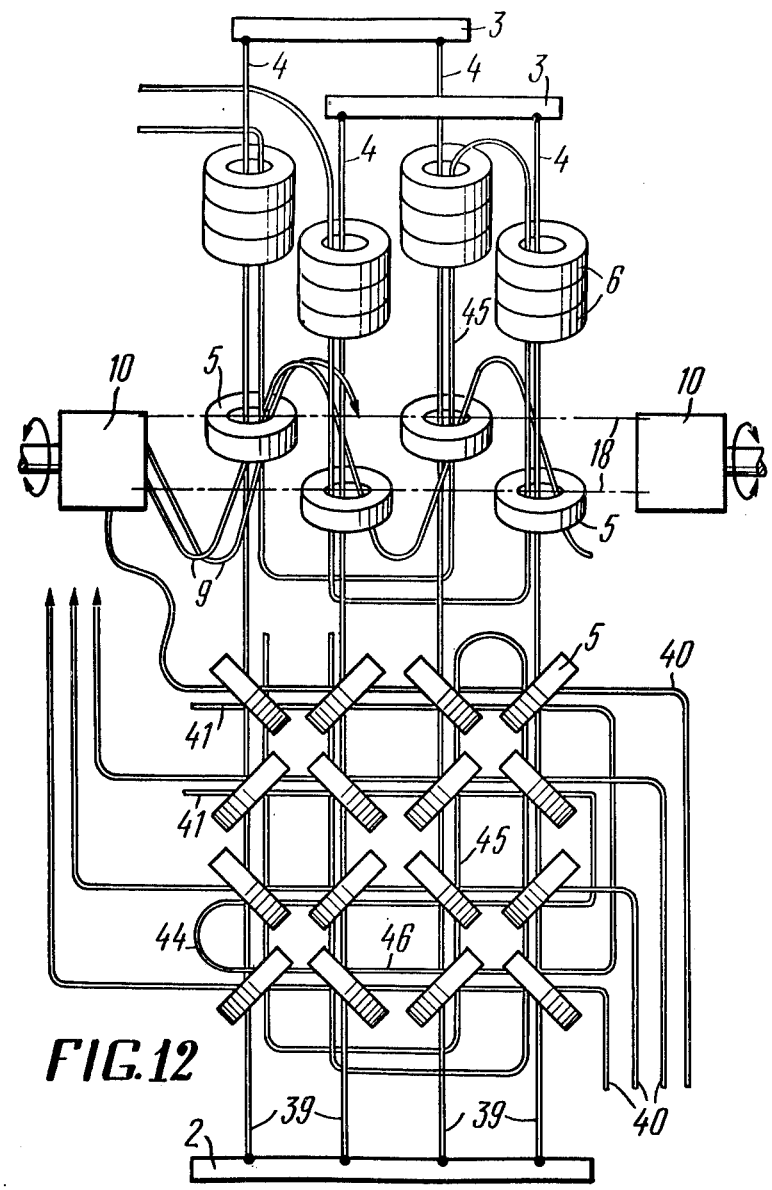
FIG. 12 is a schematic diagram of an apparatus, illustrating the method of making ferrite matrices with indexing of the adjacent cores in a line in perpendicular directions, in accordance with the invention.

Consequently, the cores 5 are arranged in the rows 18 so that they will be uniformly spaced within each row 18, the spacing being equal to the pitch of the helix 9, with the cores in one of the two rows 18 being staggered through one half of the pitch of the helix 9 with respect to the cores 5 in the other row. The distance between the two rows 18 corresponds to the diameter of the helix 9. The cores arranged in the above-described manner are threaded through by rotating the helix 9 into which the wire is being coiled. The free end of the helix 9 passes through the openings in the cores 5 and thus the wire is threaded successively through the cores. The spacing between the cores 5 in either row 18 being equal to the pitch of the helix 9, and the distance between the two rows 18 being equal to the diameter of the helix 9, the threading-through operation results in two cores 5 being received about each turn of the helix 9, one of which the helix 9 enters from above and the other one of which the helix 9 enters from below, whereby, after the helix 9 has been straightened to form a line in the ferrite matrix being manufactured, every core 5 in the line is positioned at the intersection of the respective two coordinate wires and is perpendicular to the adjacent cores, as illustrated in FIG. 12.

It can be seen from the above description that the herein disclosed method and apparatus can be employed for manufacturing ferrite matrices for decoders and logical circuits wherein it is essential that the cores 5 will occupy different positions at the intersections of the coordinate wires within a single line, in various combinations. To attain this, at the beginning of the operation of making a matrix the individual cores or groups of cores that will be turned in one direction in the line-to-be are positioned in the first row, while the cores that will be turned in the perpendicular direction at the intersections of the respective wires are positioned in the second row for the production of the same line.

Moreover, it is possible to manufacture matrices intended for permanent memory devices, wherein it is essential that cores will be either present or absent at specified intersections of the coordinate wires within a line, in accordance with a desired pattern (FIG. 1 "t"). In this case, at the beginning stage of the line-making operation only those cores are left in the row 18 which correspond to the specified pattern. The rest of the cores 5 is positioned outside the line 18.

For the cores in each line of the matrix being produced to be turned perpendicularly with respect to the cores in the adjacent lines (FIG. 1, "h" to "q"), the cores 5 arranged the successive rows 18 are alternatingly threaded through by right-hand and left-hand helices 9. Consequently, after the threading-through and straightening operations, the cores 5 at each adjacent pair of intersections of the coordinate wires in every two adjacent lines are turned in perpendicular directions.

From the above disclosure it is now clear that the ferrite matrices produced by the herein disclosed method and apparatus can have the cores therein arranged in accordance with a great variety of desired patterns (FIG. 1), each one of the cores being threaded through by either two or more wires extending in perpendicular directions.

Figure 2:
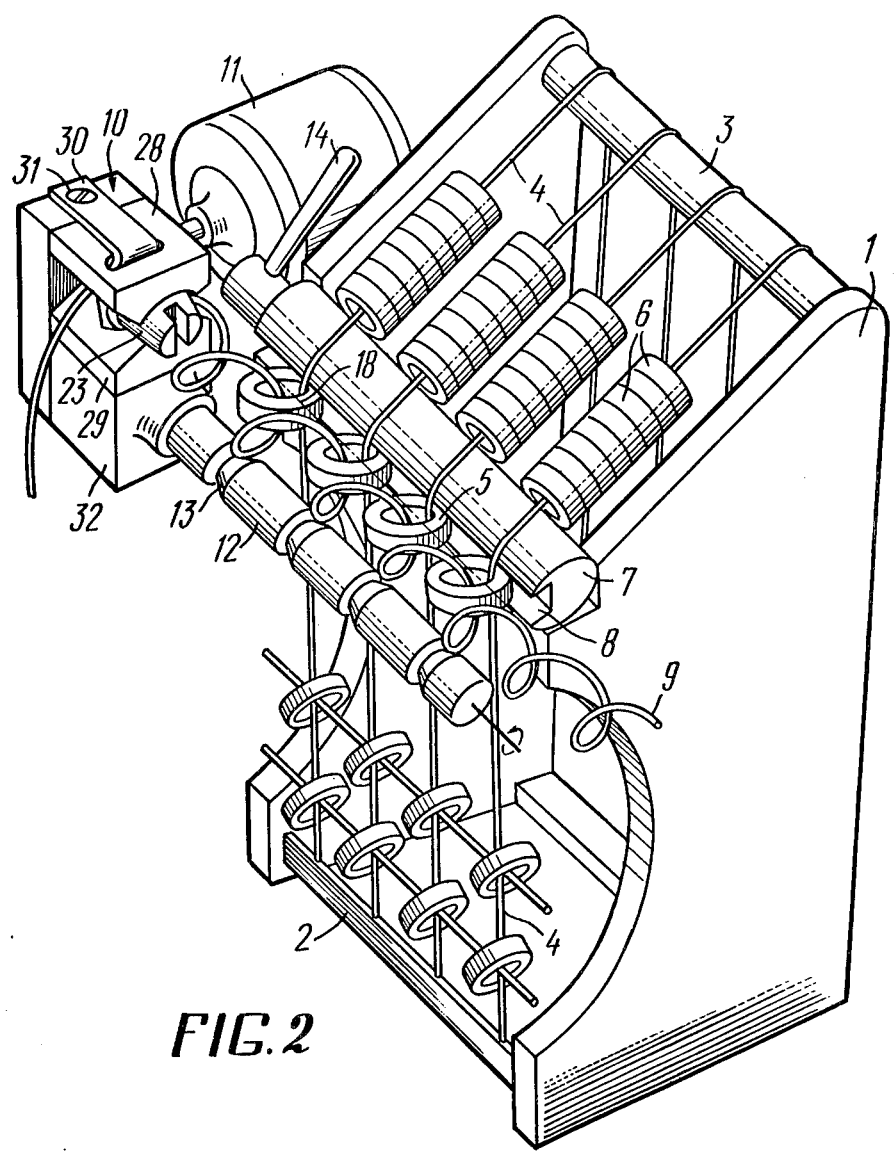
FIG. 2 is a schematic view of an apparatus for making ferrite matrices, embodying the invention.

Let us consider the operation of the apparatus for making ferrite matrices, illustrated schematically in FIG. 2.

The wires 4 with the stacks 6 of cores 5 received thereabout are secured to the plates 2 supported on the framework 1.

The wires 4 are arranged to extend parallel to one another under a slight tension, and are passed about the core-feeding member 7, with the core stacks 6 positioned above the member 7.

The core-feeding member 7 is then manually rotated with the handle 14, for the longitudinal guiding slot 8 to be aligned with the bottommost cores 5 in the respective stacks 6. Thereafter the core-feeding member 7 is rotated in the opposite direction, whereby the longitudinal guiding slot 8 separates one core 5 from each stack 6, and the separated cores 5 are subsequently arranged in a row 18.

Then the wire that is to be threaded through the cores 5 is coiled into the helix 9, for which purpose the wire is first threaded into the coiling mechanism 10. This is done by unscrewing the sleeve 26 (FIG. 7) from the housing 32 of the mechanism 10 into a position where the cleft 24 of the spindle 23 is situated in the area of the initial (the extreme left) helical grooves of the die taps 28 and 29. Then the retaining member 27 is operated to couple the spindle 23 with the sleeve 26, and the end of the wire that is to be coiled into the helix 9 is inserted into the cleft 24. By screwing the sleeve 26 together with the spindle 23 coupled therewith into the housing 32, with the sleeve being rotated in the direction of the coiling of the helix-to-be, the end of the wire is secured during the first revolution in the cleft 24 of the spindle 23, whereafter the continuing rotation results in the helix being formed about the tapering portion of the spindle 23 entering the space between the die taps 28 and 29. The pitch and the direction of the helical grooves of the two die taps corresponding to those of the thread of the sleeve 26, each turn of the helix 9 formed between the die taps 28 and 29 finds itself in its own groove. After the sleeve 26 has been screwed completely into the housing 32 of the mechanism 10, the retaining member 27 is released, and the drive 11 (FIG. 2) is operated to drive the spindle 23 (FIG. 7) via the pulley 33 in the same direction. The helix is now being coiled in the space between the die taps; the end of the wire leaves the cleft 24, and the continuous helix 9 is fed out by the coiling mechanism 10. It takes now but to cut off the leading end of the helix 9, that has been deformed by the cleft 24, and the helix is ready for threading through the cores 5 (FIG. 2).

Simultaneously with the operation of coiling the helix 9, the auxiliary roller 12 is rotated also by the drive 11 in the opposite direction at an angular speed at which the linear speed of the points of the roller 12, that contact the helix 9, to be slightly higher than that of the corresponding points of the helix 9.

The helix 9 rotates and at the same time progresses translatorily in engagement with the auxiliary roller 12 and with the core-feeding member 7, the leading end of the helix 9 entering successively the openings in the successive cores 5 from above, strictly at the centers of the respective openings, thanks to the provision of the guiding annular grooves 13 in the auxiliary roller 12. Moreover, the interaction of the roller 12 with the helix 9 supplies additional rotation to the latter, which is required for compensation of the residual stresses in the helix 9, brought about by the coiling operation, as well as for overcoming the friction of the helix 9 against the core-feeding member 7, in which way it is possible to thread the helix 9 through the cores 5 arranged in a line of a considerable length.

After the leading end of the helix 9 has passed through all the cores 5 in the row, the helix 9 is severed at the outlet of the mechanism 10, and the auxiliary roller 12 is swung aside to clear the path of the helix 9 supporting the cores 5 thereabout.

Then the core-feeding member 7 is rotated with the handle 14, for the cores 5 with the helical wire 9 passing therethrough to leave the longitudinal guiding slot 8 of the member 7, whereafter the cores 5 are lowered along the respective wires 4. Then the wire coiled into the helix 9 is straightened, whereby a coordinate wire grid is formed, with the cores positioned at the intersections of the wires and turned strictly diagonally in the same direction with respect to the wires. The operation of forming a line of a ferrite matrix is thus completed.

For making the successive lines in the matrix, the above operation is repeated, starting with returning the auxiliary roller 12 into the operating position thereof.

The operation of threading the helix through a line of a matrix may be completed each time by the helix being severed; however, in cases when it is necessary to bend back the same wire for threading through the successive line, e.g. for making a readout-inhibition winding, or else as part of producing matrices of a great capacity, when the wire threaded through a line in one apparatus is to be handed over without being severed to another apparatus, so that the line might be continued with the same wire, the helix 9 can be removed from the mechanism 10 without the necessity of severing the wire intermediate of the helix and the supply spool (not shown) from which the wire is unwound.

So, to remove the ready helix together with a length of straight, i.e. uncoiled wire, the sleeve 26 (FIG. 7) is screwed out, whereby the spindle 23 is withdrawn from the helix 9, and the latter can be easily removed from the now empty space between the die taps 28 and 29 of the mechanism 10.

The second embodiment of the wire coiling mechanism 10 (FIG. 8) offers a possibility of coiling the wire into a helix either of the left-hand direction or of a right-hand direction, and that without any re-adjustment of the mechanism itself. Let us consider the operation of this mechanism, presuming that the first sleeve 26 (FIG. 8) is provided with a right-hand thread, and the sleeve 34 is screwed into the housing 32 of the mechanism 10 and is provided with a left-hand thread.

Then, in order to produce a right-hand helix, the retaining member 35 is released, and the wire is threaded into the mechanism in the manner described hereinabove in connection with the first embodiment (FIG. 7) of the wire coiling mechanism 10.

When a left-hand helix is to be produced, the mechanism 10 (FIG. 8) has the wire threaded thereinto in the following way. First, both retaining members 27 and 35 are brought into their retaining positions. The drive, which in this case should be reversible, is operated to drive the entire mechanism via the pulley 33, the mechanism being positively coupled by the retaining members 27 and 35. In this way the mechanism is rotated in the right-hand direction and is thus unscrewed from the housing 32, until the cleft 24 of the spindle 23 is positioned adjacent to the initial grooves of the helix-forming die taps 28 and 29. The leading end of the wire is inserted into the cleft 24, and the drive is reversed to coil a left-hand helix about the tapering portion of the spindle 23. When the mechanism is screwed back into the housing 32 as far as it will go, the retaining member 27 is released, and the spindle 23 alone is rotated in the same direction (i.e. the left-hand direction). Now the left-hand helix that is being continously coiled about the tapering portion of the spindle 23 is fed out by this spindle of the mechanism 10.

The ready helix 9 can be removed without the wire being severed in a way similar to that of removing a right-hand helix by the retaining members 27 and 35 being operated into their retaining positions, and the drive 11 being reversed. The spindle 23 is withdrawn from the helix into the die taps, and the helix can be easily removed from the mechanism 10.

Let us consider now certain individual operations and their stages, when their order is somewhat different from the abovedescribed process of making ferrite matrices (FIG. 1 "a") by the herein disclosed apparatus, the difference residing solely in the operations of threading the wire into the mechanism 10 (FIG. 2), in the modifications of applying the core stacks 6 onto alternating wires, in arranging the cores 5 in a plurality of rows 18, in necessity of employing either a plurality of core-feeding members 7 or core-feeding members of a modified structure, or else in employment of additional auxiliary mechanisms.

FIG. 1 "a" shows the ferrite matrix manufactured by the operation similar to that described hereinabove in connection with the operation of the apparatus illustrated in FIG. 2.

FIG. 1 "b" shows the ferrite matrix produced by the operation, as in FIG. 1 "a", except that one mechanism 10 for coiling the wire into the helix 9 is mounted at each side of the core-feeding member 7, the operations of threading the wire into these two mechanisms being performed alternatingly, i.e. the wire is first threaded into the left-hand mechanism 10, and then into the right-hand one, in which way the winding 43 is formed.

FIG. 1 "c" shows the ferrite matrix made by steps described hereinabove in connection with FIG. 1 "b", except that after the matrix is made a digital winding 44 is formed by the wire loops at one side of the matrix being severed.

FIG. 1 "d" shows this ferrite matrix produced by an operation similar to that described in connection with FIG. 1 "a;" additionally, a wire intended as a readout-inhibition winding 45 is threaded in by an operation similar to that of making the winding 43 in FIG. 1 "b," the cores 5 (FIG. 2) arranged in the row 18 being threaded through with two independent wires coiled into two helices 9.

FIG. 1 "e" shows the ferrite matrix made by steps similar to those described in connection with FIG. 1 "c," except that at the initial stage of making this matrix each stack 6 (FIG. 2) of the cores is put about two straight wires.

FIG. 1 "f" shows the operation like that described in connection with FIG. 1 "a;" the readout-inhibition winding 46 being formed a the beginning of the matrix-making process, the stacks 6 (FIG. 2) of cores being threaded through with two wires for each stack, one of the two wires, intended to be made into the winding 47 (FIG. 1), being threaded successively through all the stacks, the end portions of this wire forming loops 48 entering two adjacent stacks from the same side; the number of the cores in each stack being the number of the cores in the column of the matrix-to-be.

FIG. 1 "g" shows the coordinate wires of the ferrite matrix threaded through by the steps described in connection with FIG. 1 "a," and the windings 49 and 50 are formed by the steps described in connection with FIGS. 1 "b" and 1 "f."

FIG. 1 "h" shows the ferrite matrix made by the steps described in connection with FIG. 1 "a;" when the odd lines of the matrix are made, the cores 5 (FIG. 2) arranged the row 18 are threaded through with the helix 9 of one direction, while the even lines are threaded through with the helix of the opposite direction.

FIG. 1 "i" shows the ferrite matrix made by the steps described in connection with FIG. 1 "h," and the second winding is threaded through by the steps described in connection with FIG. 1 "c."

FIG. 1 "j" shows the ferrite matrix made by the steps described in connection with FIG. 1 "h," the readout-inhibition winding 51 being threaded through by the steps similar to those described in connection with the winding 45, FIG. 1 "d."

FIG. 1 "k" shows the coordinate wires threaded through by the steps described in connection with FIG. 1 "h," and the readout-inhibition winding 54 is made by the steps described in connection with FIG. 1 "f."

FIG. 1 "l" shows the steps of threading through the coordinate wires similar to those described in connection with FIG. 1 "h;" the windings 52 and 53 are threaded through by the steps described in connection with FIG. 1 "g."

FIG. 1 "m" shows the ferrite matrix made by the steps described in connection with FIG. 1 "a," the cores 5 (FIG. 4) to be threaded through with the helix 9 being arranged in two rows 18 by two core-feeding members 7, or else by one feeding member 15 (FIG. 3), or, alternatively, they are arranged by the core-feeding member 7 (FIG. 5) with the help of the grippers 19. In any case, the second wire, passing from one line to another, is threaded through in the form of helices of opposite directions.

FIG. 1 "n" shows this ferrite matrix is made, the cores are threaded through by the steps described in connection with FIG. 1 "m" hereinabove, and the readout-inhibition winding 55 is threaded through by the steps described in connection with FIG. 1 "b."

FIG. 1 "o" shows the operation of making this matrix similar to that described in connection with FIG. 1 "c" and "m."

FIG. 1 "p" shows the ferrite matrix is made by the steps described in connection with FIG. 1 "f," the threading through and the arrangement of the cores into the row being similar to those described in connection with FIG. 1 "m."

FIG. 1 "q" when the ferrite matrix is made, the coordinate wires are threaded through the cores by the steps described in connection with FIG. 1 "m," and the windings 56 and 57 are threaded through, as described hereinabove in connection with FIG. 1 "g."

FIG. 1 "r" shows when the ferrite matrix is made, the coordinate wires are threaded through by the steps described in connection with FIG. 1 "b;" the winding 58 is threaded through, as follows: the cores 5 (FIG. 6) arranged in the row 18 and threaded through with one helix 9 forming the second coordinate wire are not removed from the sections 22; prior to threading the second helix therethrough, one section of the core-feeding member 22 is turned about, whereby the lower longitudinal guiding slot 8 thereof is placed opposite the upper longitudinal guiding slots 8 of the other sections 22, whereafter one line is threaded through with the helix 9; when the abovementioned section 22 of the feeding member is turned in the opposite direction for the opposing longitudinal guiding slots to align, whereafter the cores 5 are threaded through once again. Then the sections 22 of the core-feeding members are rotated into a position where the cores with the wires threaded therethrough slide down along the wires 4; then the wires are tightened, in which way there are produced two threaded-through lines of the matrix having three wires passing therethrough, with a "butterfly" pattern of the winding 58.

FIG. 1 "s" the coordinate wires are threaded through the cores of the ferrite matrix in a sequence described hereinabove in connection with FIG. 1 "d," the apparatus being that illustrated in FIG. 5. The cores 5 that are to be turned in a line in the opposite direction are arranged in the second row 18 with the help of the grippers 19 associated with the actuators 20.

FIG. 1 "t" shows the cores of this matrix threaded through in the apparatus illustrated in FIG. 5. The threading-through process is the one described in connection with FIG. 1 "a," except that those of the cores 5 (FIG. 5) that are to be threaded through are retained in the row, while the rest of the cores are displaced to lie outside the row.

FIG. 1 "u" shows this ferrite matrix made by the steps described in connection with FIG. 1 "m," but the direction of the helix threaded through the cores along the second coordinate is not reversed from line to line.

FIG. 1 "v" shows this ferrite matrix made, as follows: the first two lines of the matrix are made by the steps described in connection with FIG. 1 "a;" the two successive lines are made by the same steps, but the direction of the helix being threaded through is reversed.

FIG. 1 "w" shows the process of threading through, when this matrix is being made, similar to that described in connection with FIG. 1 "i," except that at the beginning of the operation each stack 6 (FIG. 2) is put about two wires.

Described hereinabove was the operation of the herein disclosed apparatus for production of ferrite matrices, in connection with various arrangements and patterns of the cores in the matrices, each core in each matrix being threaded through either with two or with more than two wires.

Let us now consider the sequence of operations and steps of the process of making a ferrite core memory in the form of a plait 36 (FIG. 9) on the apparatus for production of ferrite matrices, constructed in accordance with the present invention.

The wires 4 of the first coordinate direction (FIG. 2), of a length sufficient for making all the matrices of the core memory, are put through the stacks 6 of the cores 5 of which the number is likewise sufficient for making all the ferrite matrices of the core memory. Then the appropriate ones of the steps described hereinabove in connection with FIG. 1 "d," "f," "g," "j," "k," "l," "n," "p," "q," "r," "s" are employed for making the first matrix of the plait 36 (FIG. 9), whereafter other successive matrices are made; when the first matrix is made, there is passed through the threaded-through row of the cores a reserve length of a straight wire, sufficient for forming the second coordinate direction throughout the plait 36. Then the plate 2 is displaced to the border line separative the first matrix from the successive one, the wires 4 not being severed.

Then the second matrix is made, the helices 9 for threading through the lines of this second matrix being coiled from the reserve length of the wire, left after the similar lines of the previous matrix have been threaded through, in the same sequence and in the same direction. Moreover, when the threading-through of each successive line of the second matrix is completed, the wire is taken up to reduce the gap between the two matrices, with the released lower right-hand corner of the preceding matrix coming close to the lower left-hand corner of the successive one, in which way the cylindrical shape of the ferrite core memory is attained.

The ferrite core memory (FIG. 10) is assembled from flat matrices overlying one another, with the aid of the apparatus shown in FIG. 2, without soldering of the coordinate wires intermediate of the matrices, the wires being solid wires passing through the entire core memory. The matrices making up the core memory illustrated in FIG. 10 may have any of the patterns illustrated in FIG. 1.

The steps and operations of the process of making the core memory illustrated in FIG. 10 are similar to those of the process of making the plait-like core memory 36 (FIG. 9), the only difference being that in the case of the shown in FIG. 10 the first line and the successive lines of the second matrix have threaded therethrough the end of the wires, respectively, of the last of the lines of the preceding matrix. When the threading through of one matrix 37 (FIG. 10) is completed, and the threading through of the successive matrix is started, the mechanisms 10 disposed at the opposite face ends of the core-feeding member are alternated, in which way every successive matrix is threaded through from the side opposite to that from which the preceding matrix was threaded through.

Thus, the present invention makes it possible to introduce mechanization and automation into the process of threading ferrite matrices of great capacities, incorporating the tiniest ones of ferrite cores, and that with considerably reducing the amount of soldered connections in a ferrite core memory.

Furthermore, the invention reduces to a great degree the strain of the operator's eyes, increases the productivity of labor, provides the possibility of performing mechanized threading of a digital winding, with transition from one coordinate line into another within the matrix being made, offers the choice of any desired pattern of the angular positions of the cores at the intersections of the coordinate wires, provides for introducing mechanization into the production of the ferrite core matrices of permanent memory devices, reduces the electrical losses, improves the dynamic characteristics and the heat transfer capacity of memory devices, facilitates access to the memory elements in a ferrite core memory made in accordance with the herein disclosed method, offers combining of the operations of making ferrite matrices and of checking-up the memory elements thereof and making good the faults, reduces the time needed for performing the operations, improves the quality of the product and reduces its cost.

Moreover, the herein disclosed method makes it quite simple to check the electric properties of the ferrite cores being threaded and thus to eliminate the faults of the matrices being made directly in the course of the threading operation.

The testing of the electric properties and the elimination of the faults includes several operations that are performed simultaneously with the process of threading and is carried out, as follows hereinafter.

Figure 13:
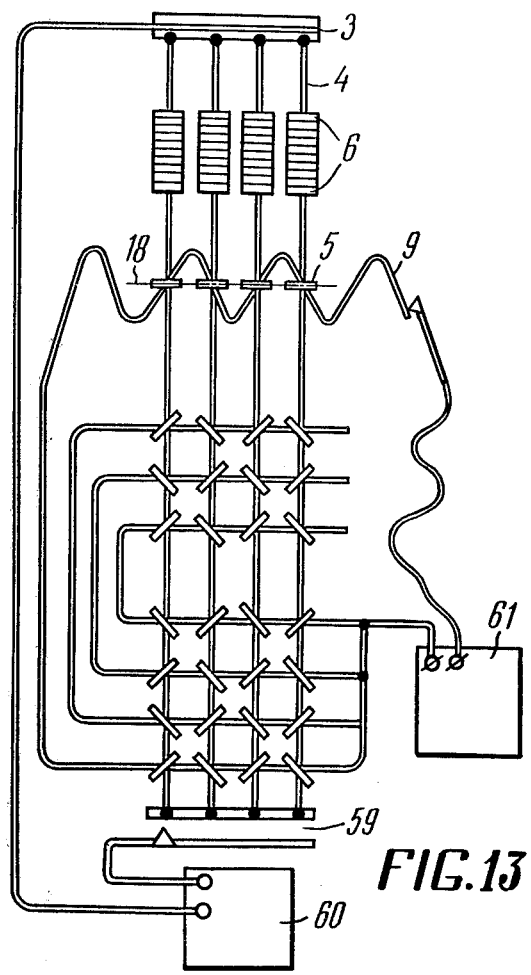
FIG. 13 illustrates the method of testing ferrite matrices, according to the invention.

The wires 4 (FIG. 13) that pass through the stacks 6 of the cores 5, which latter act as a quite definite load applied to these conductor wires, are connected through a terminal device 59 and the wire-mounting strip 2, acting as the common bus-bar, have sent thereto a test program of current pulses coming from a pulse generator 60, to each wire in succession.

The cores having the helix 9 threaded therethrough are connected to a readout amplifier 61, with the aid of which check-up pulses are derived from each core about the helix 9.

If a faulty core is detected in the row through which the helix 9 has been threaded, the helix is removed, i.e. withdrawn from the threaded line, for instance, by reverse rotation of the helix. The faulty core is then broken and thus put off the respective wire 4. The following core 5 from the respective stack 6 on the wire 4 is forwarded to replace the faulty one. Thereafter the row of the cores, in which the faulty core has been replaced, is rethreaded with the helically wound wire 9, and then it is tested once again. When no faulty cores are detected in the threaded line, the following row is forwarded and threaded through.

To increase the quality of group measurement and to make the testing conditions resemble those of actual operation of a ferrite cube, the properties of the cores may be alternatively tested with the aid of a third wire which, in the course of the threading operation, is also wound into a helix and is threaded additionally throught the cores 5 arranged in the row 18. The rest of the testing and fault correcting operations are in the last-mentioned case similar to those described hereinabove.

What is claimed is:

1. A ferrite core memory in the form of a cylindrical hollow plait, comprising: a plurality of matrices comprising ferrite cores threaded with mutually perpendicular coordinate wires and wires forming readout and inhibition windings; the matrices being connected edge to edge and helically wound to form the cylindrical surface of the plait, with a helical junction between adjacent matrices the coordinate wires forming opposed helices lying on the cylindrical surface of the plait; and outgoing leads of the readout and inhibition windings being distributed longitudinally of the plait along said junction.

* * * * *